United States Patent
Butt et al.

(10) Patent No.: US 7,074,529 B2
(45) Date of Patent: Jul. 11, 2006

(54) PHASE-SHIFT MASK

(75) Inventors: Shahid Butt, Ossining, NY (US); Gerhard Kunkel, Radebeul (DE)

(73) Assignee: Infineon Technologies AG, Munich (DE)

(*) Notice: Subject to any disclaimer, the term of this patent is extended or adjusted under 35 U.S.C. 154(b) by 167 days.

(21) Appl. No.: 10/787,118

(22) Filed: Feb. 27, 2004

(65) Prior Publication Data

US 2004/0229134 A1 Nov. 18, 2004

Related U.S. Application Data

(63) Continuation of application No. PCT/EP02/09179, filed on Aug. 16, 2002.

(30) Foreign Application Priority Data

Aug. 28, 2001 (EP) .................................. 01120508

(51) Int. Cl.
*G01F 9/00* (2006.01)

(52) U.S. Cl. ......................................................... 430/5

(58) Field of Classification Search .................... 430/5; 716/19, 21
See application file for complete search history.

(56) References Cited

U.S. PATENT DOCUMENTS

| 5,487,963 | A  |   | 1/1996  | Sugawara |
|---|---|---|---|---|
| 5,629,113 | A  |   | 5/1997  | Watanabe |
| 5,637,424 | A  | * | 6/1997  | Haruki et al. .................. 430/5 |
| 5,700,606 | A  |   | 12/1997 | Kobayashi et al. |
| 5,744,268 | A  | * | 4/1998  | Nakao ........................... 430/5 |
| 6,534,242 | B1 | * | 3/2003  | Sugita et al. ................ 430/312 |

* cited by examiner

*Primary Examiner*—S. Rosasco
(74) *Attorney, Agent, or Firm*—Edell, Shapiro & Finnan, LLC (57) ABSTRACT

The relative surface area sizes of portions having distinct phase-shift and transmission of light of a pattern on a phase-shift mask substantially obey the condition that the product of surface area and transmission of the electrical field strength is the same for all of the portions. Then, frequency doubling occurs due to vanishing zero order diffraction orders and in the case of high-transition attenuated phase-shift masks a large first order diffraction amplitude reveals an even an improved as compared with conventional phase-shift masks. Two-dimensional matrix-like structures particularly on attenuated or halftone phase-shift masks can be arranged to image high-density patterns on a semiconductor wafer. The duty cycles of pattern matrices can be chosen being different from one in two orthogonal directions nevertheless leading to frequency doubling.

8 Claims, 6 Drawing Sheets

PHASE-SHIFT MASK

CROSS REFERENCE TO RELATED APPLICATIONS

This application is a continuation of PCT application No. PCT/EP02/09179, filed on Aug. 16, 2002, and titled "Phase-Shift Mask", which claims priority from European Patent Application No. EP 01120508.5, filed on Aug. 28, 2001, and titled "Phase-Shift Mask," the entire contents of which are hereby incorporated by reference.

FIELD OF THE INVENTION

The invention relates to a phase-shift mask having at least one first pattern, which is arranged in a two-dimensional matrix with a multiple of second patterns, which are substantially identical to the first pattern.

BACKGROUND

The minimum resolvable structure width of an exposure tool projection system for transferring a pattern structured on a mask onto a semiconductor wafer being coated with a resist given by the term 0.25·$\lambda$/NA can theoretically be achieved by employing a full set of litho-enhancement techniques. In the formula, $\lambda$ is the wavelength of the illuminating light and NA is the numerical aperture of the pupil plane, or the object lens system, respectively. The coefficient k1=0.25 is particularly challenging, and the techniques are either not yet appropriately matured or operate only under restricted conditions, e.g., for certain patterns on the mask.

Typical exposure tools operate with k1=0.4 for simple periodic lines-and-spaces patterns. A most promising candidate for imaging down the minimum structure width to 0.3·$\lambda$/NA derives from the use of alternating phase-shift masks. While not yet in a production status, this kind of mask enhances the resolution capability of a projection system in combination with the lines-and-spaces patterns. E.g., chrome lines are alternatiingly separated by spaces having two opposite degrees of phase-shift, which is exerted on the light, that traverses the mask to expose the wafer. The alternating degree of phase-shift considerably enhances the amount of structure contrast.

While it is a straightforward approach to apply alternating phase-shifts to transparent portions of the patterns, i.e., spaces, in a one-dimensional grid of structures, i.e., lines and spaces, an application in two-dimensional periodic structures is more complicated. For example, a dense structure matrix of contact holes necessitates, in the case of alternating phase-shift masks, there are always two neighboring contact holes, which in being transparent both comprise the feature of the same phase-shift. The assignment of two phases allows either to get maximum contrast in y-direction or a maximum contrast in x-direction, but no simultaneous improvement of the contrast is possible.

The use of attenuated phase-shift masks, or half-tone masks, is already matured, and is used in manufacturing of mask mass products. Attenuated phase-shift masks do not have the resolution capability for exposure tools as in the case of alternating phase-shift masks, or their chromeless supplements. The practice of manufacturing all kinds of phase-shift masks stated above is well-known to ordinary persons skilled in the art, and will not be described further herein.

SUMMARY

Facilitating a higher resolution capability by improving the structure of phase-shift masks used to project a pattern onto a semiconductor wafer is desirable.

A phase-shift mask can have at least one first pattern, which is arranged in a two-dimensional matrix with a multiple of second patterns, which are substantially identical to the first pattern. The first pattern can include at least a first portion having a first area, a first transmission of light to be a irradiated through the mask, a first phase-shift exerted on light traversing the mask through the first portion, at least a second portion having a second area, a second transmission of light to be irradiated through the mask, and a second phase-shift exerted on light traversing the mask through the second portion. The second phase-shift can be different from the first phase-shift. The product of the first area of the first portion times the first transmission can be substantially equal to the product of the second area of the second portion times the second transmission.

According to the present invention, a feature commonly utilised in alternating phase-shift masks is extended to two dimensions separately, and applied to the case of attenuated phase-shift masks. In particular, a duty cycle of 1, i.e., the width of the line is equal to the width of the space in a lines-and-spaces pattern on an alternating phase-shift mask, can lead to a vanishing zero diffraction order in the Fourier spectrum. This can result in a frequency doubling effect with respect to the number of structurable patterns per length unit. An extension to two orthogonal directions of this effect has not yet been applied with different duty cycles for each direction. With the present invention, enabling duty cycles of the pattern matrix that can be different from one in two orthogonal directions can afford this extension, and thus provide a frequency doubling of structures in two dimensions.

Transmission of light through a mask denotes the percentage, or factor respectively, of electrical field strength, that is not absorbed or reflected by the mask, thus being transmitted. The power of light amplitude is determined from the square of the electrical field strength of the light traversing the mask.

Depending upon the transmission, as measured in terms of power of light, of half-tone phase-shift masks, which typically amounts to 5% to 7% in conventional half-tone phase-shift masks, the areas of the respective portions providing the attenuated or non-attenuated light enabling a contrast-enhancing interference can be adjusted at the stage of design of the masks in order to provide the frequency doubling effect also in this type of masks.

A matrix of similar patterns can provide a larger structure to be projected onto a wafer. This means, that not only a first pattern is similar to a second pattern adjacent the first pattern, but also that these patterns provide a periodic pitch in each direction. This pitch can vary between the first and the second dimension/direction on the mask.

With the term pattern, an element of the matrix structure is denoted, that is substantially identically repeated in both dimensions on the mask, and which directly borders the next matrix element in the next pattern. Therefore, a phase-shift mask provides at least two portions within this pattern, the first having a first amount of phase-shift, e.g., 0, and a second portion having a second amount of phase-shift, e.g., $\pi$.

Particularly as to transmission factors of the respective portions being different from each other, i.e., the phase-shift mask being a half-tone or attenuated phase-shift mask, the invention can include a transmission-weighted surface area equivalent to these portions.

As to alternating phase-shift masks having extra chrome portions or chromeless phase-shift masks, there can be a negligible amount of attenuation due to each of the portions, e.g., interference effects inside the etched quartz holes. The side effect of attenuation due to the quartz or glass material of the mask will be disregarded here. In this document attenuation is considered to be due to a deposited surface layer material only, e.g., molybdenum-silicon or other phase-shifting materials.

The frequency doubling effect can arise, when the light contributions of the first and second portion having different phase-shifts are equal. In the former case of alternating phase-shift or chromeless masks this requirements leads to the same size of the zero- and π-phase shifting portions, i.e., area of these portions. The area is to be taken as the two-dimensional surface measure of the portions as projected into the surface plane of the mask.

In the latter case of half-tone or attenuated phase-shift masks, the area of the attenuated phase-shifting portion, e.g., the second portion, has to alleviate its attenuation by having a larger area, which is larger by a factor being reciprocal to the transmission of light as being provided in terms of electrical field strength.

For example, a 5% transmission in terms of power of light would necessitate an area of the second portion being roughly 4–5 (square root of factor 20) times larger than the first portion, which is considered to reveal zero attenuation. 5% transmission in terms of power of light corresponds to its square root of 22.36% transmission of to electrical field strength.

Since in the case of dense structuring both structures, i.e., portions, would require large pattern sizes, low transition half-tone phase-shift masks would be comparatively ineffective with the present invention. Therefore, the present invention becomes particularly advantageous in the case of high-transition phase-shift masks, e.g., with attenuations larger than 0.5.

In a further aspect, the case of chrome structures constituting a third portion is considered. In this case these non-transparent regions do not impact the requirements according to the present invention. The relevant feature according to the present invention is the relative area of the first and second portion being fully transparent or attenuating. The procedure of varying the area of a portion within a pattern as defined in this document is also called biasing at the design stage of a mask.

BRIEF DESCRIPTION OF THE FIGURES

Further advantages and features of the present invention will be better understood by reference to embodiments taken in conjunction with the accompanying drawings, wherein.

DETAILED DESCRIPTION

Figure 1:
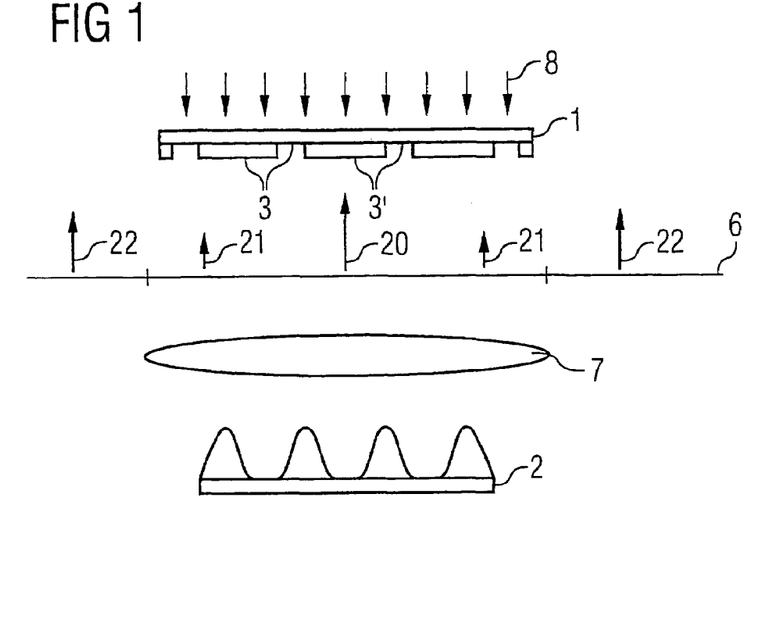
FIG. 1 shows the generation of diffraction orders in the pupil plane of the projection system, FIG. 2 displays the vanishing zero diffraction order in a alternating phase-shift mask projection of a lines-and-spaces pattern.

A schematic of an exposure tool, e.g., a projection stepper, is shown in FIG. 1. A periodic reticle structure can include a multiple of patterns 3, 3' and can be projected from a phase-shift mask 1 through a lens 7 onto a semiconductor wafer 2 by irradiating light 8 at a given wavelength through the mask 1. The semiconductor wafer 2 is exposed and structured with a resolution depending on the pattern size on mask 1, the lens 7 characteristics and the aperture size enabling different Fourier diffraction orders to contribute to the image on semiconductor wafer 2, among others.

Diffraction orders in the Fourier spectrum, that are positioned at the distance of and within the pupil aperture form 6, contribute to the final image on the wafer. For a simple lines-and-spaces pattern, which is close to the resolution limit of the projection system, the amplitude of the first harmonic is an important parameter, that controls, e.g., the image or structure contrast.

Figure 2:
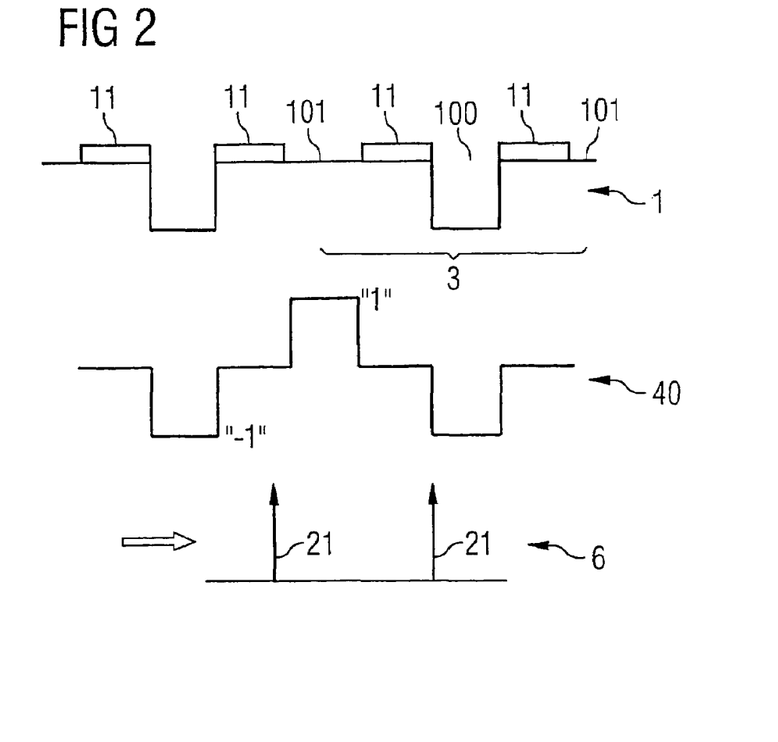

The principle of an alternating phase-shift mask is depicted in FIG. 2. In the side view of a lines-and-spaces pattern that forms a pattern 3, a first portion 100 can be etched into the quartz material of the mask 1, thereby providing a phase-shift of, e.g., π. A second portion 101 of pattern 3 can be transparent, but has not been etched, thus providing substantially no phase-shift (0). These two portions 100, 101 constituting the alternating phase-shifting spaces can be separated by non-transparent chrome structures 11.

The middle section of FIG. 2 shows the electrical field 40 of the light as emerging from the pattern 3, while in the bottom section the amplitudes of the diffraction orders in the pupil aperture 6 are displayed.

In the projection, a different optical path length of these portions alters the phase of the electrical field 40 with respect to conventional chrome-on-glass masks as shown in FIG. 2. This feature leads to a frequency doubling due to vanishing zero order diffraction 20 in the frequency space. The amplitude of the first diffraction orders 21 can be calculated to 2.83/2π.

There is no frequency doubling for chrome-on-glass masks (COG-masks) or conventional attenuated phase-shift masks (HTPSM). Therefore, the Fourier spectra contain a zero diffraction order and the amplitude of the first harmonic is generally calculated to 2/2π for chrome-on-glass masks and, e.g., to 2.49/2π for attenuated phase-shift masks with 6% transmission. Obviously, alternating phase-shift masks (APSM) provide a superior contrast as compared with COG-masks or HTPSM.

Figure 3:
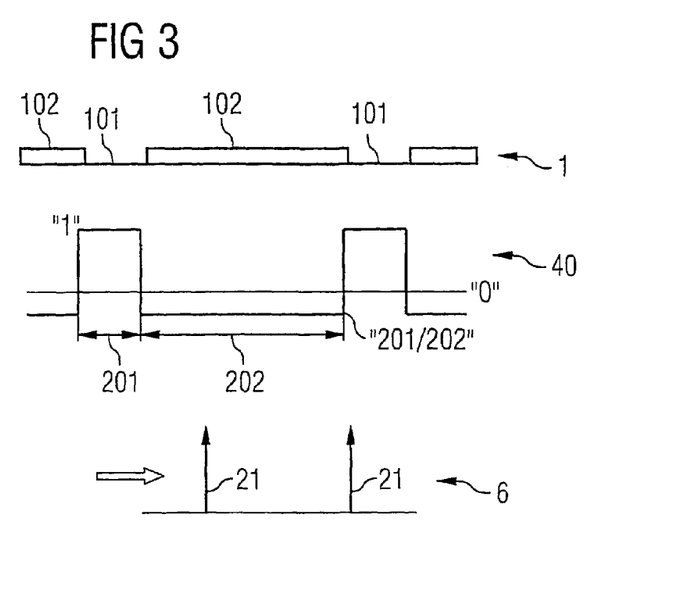
FIG. 3 shows the vanishing zero diffraction order in a projection of a pattern according to the present invention of an attenuated phase-shift mask.

An embodiment of the present invention concerning HTPSM is depicted in the side view of FIG. 3, upper section. First portions 101 having no attenuation and phase-shift can be embedded in second portions 102 including a top layer of molybdenum-silicon, which attenuates and phase-shifts light 8 irradiated onto the mask 1. The electrical field strength 40 of light emerging from mask 1 is shown in the middle section of FIG. 3. If the surface area 201 of the first portion 101 equals the surface area 202 of the second portion 102 times the transmission factor for electrical field strength 40, the zero order diffraction 20 vanishes resulting in frequency doubling.

For simplicity, the surface areas in FIG. 3 are displayed as arrows in a first direction; the second direction stretching the actual surface area is to be considered as orthogonal to the document plane.

Figure 4:
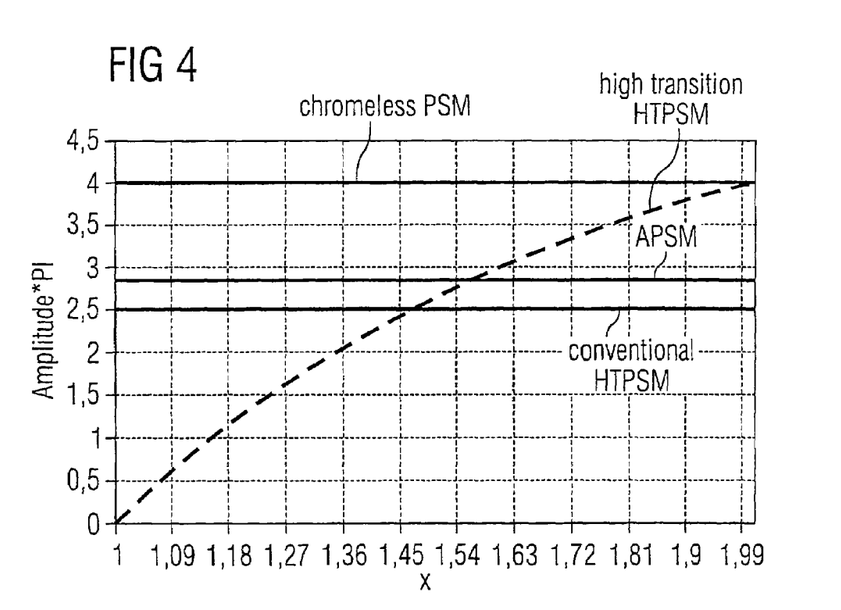
FIG. 4 shows the dependence of first diffraction order amplitude as a function of attenuation (added by one) for attenuated phase-shift masks as compared with other kinds of phase-shift masks.

In the diagram of FIG. 4, the first order harmonic amplitudes of a HTPSM being structured with a simple lines-and-spaces pattern are given as a function of transmission, as compared with the corresponding values for APSM (2.83/2π), chromeless PSM (4.00/2π) and conventionally structured 6% HTPSM (2,49/2π). For a transmission of an electrical field strength 40 of 47%, i.e., already a high-transition PSM, the first order harmonic becomes better than 6% HTPSM, and for 56% even the amplitude of an APSM is exceeded.

Figure 5A:
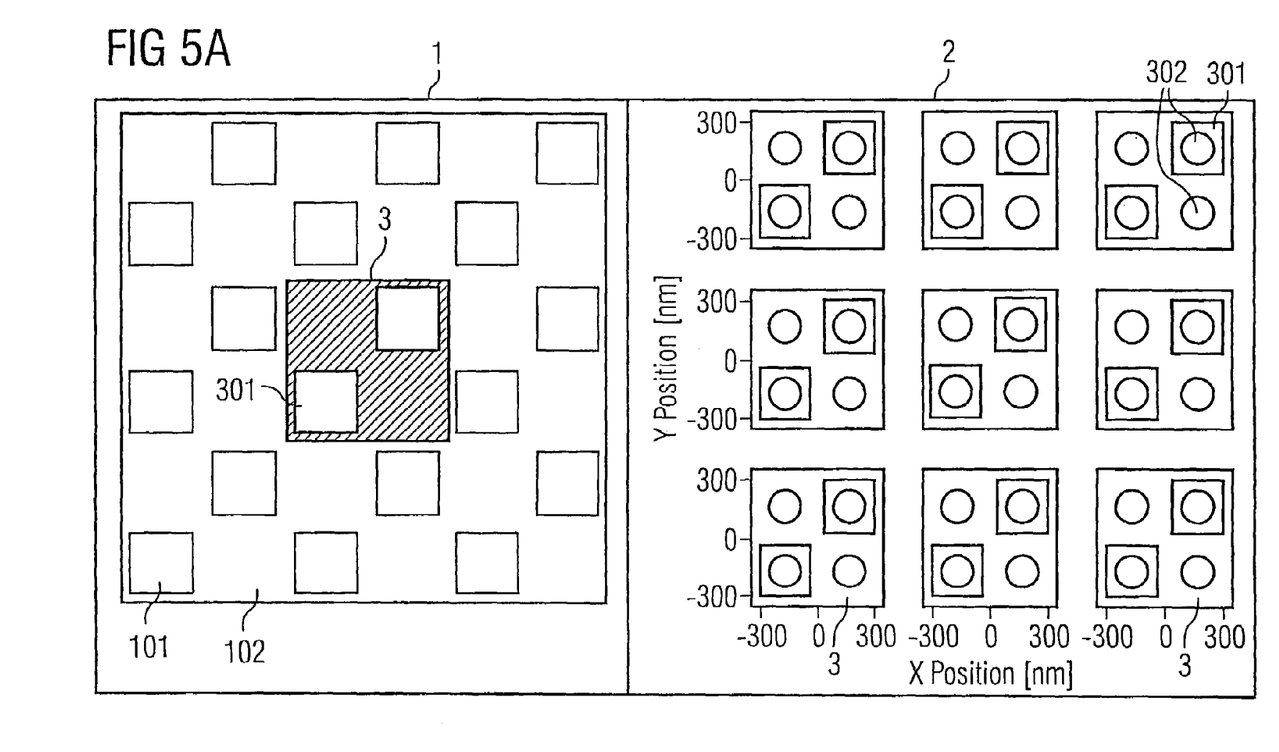
FIGS. 5A and 5B show a first embodiment of a phase-shift mask pattern according to the present invention (a) and its result when projected onto a wafer (b)

The extension to two dimensions is shown in FIG. 5, where a simple embodiment of the present invention of a pattern 3 including two fully transparent contact holes 301 (the first portion 101) on the mask 1 embedded in a semitransparent surroundings (second portion 102), which are positioned in a diagonal manner with respect to each other, is shown (left side). The imaged structures 302 on the semiconductor wafer 2 are also displayed (right side), when scaled to the same dimensions as mask 1. Frequency doubling is evident. The surface area of the attenuated region, i.e., the second portion 102, can be weighted with the transmission according to the present invention, which results in vanishing zero order diffraction amplitudes. In FIG. 5A, right hand side, positions of the contact holes on the mask 1 are plotted over the imaged structures 302 on the wafer 2.

Figure 5B:
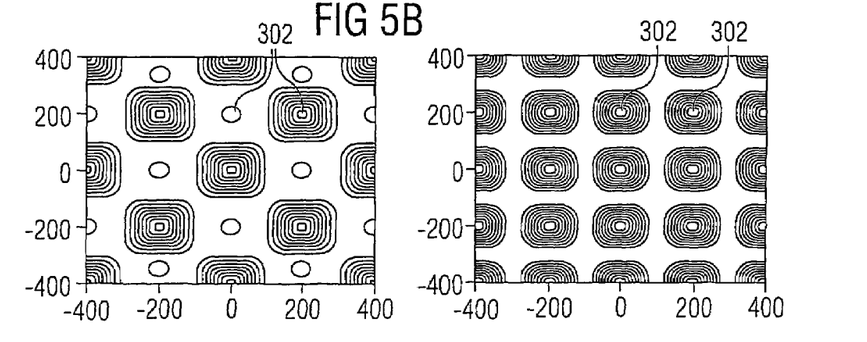

In FIG. 5B, a situation of FIG. 5A with a deviation (left side) from the condition of same sizes of the first and second portion weighted with the electrical field transmission of the attenuated portion is compared with a situation substantially fulfilling this condition (right side), which accords to the present invention. If the contact holes become only slightly larger or smaller than the equivalence condition, frequency doubling is efficiently removed and a similar pattern structure as apparent from the mask 1 is imaged onto the wafer, i.e., a diagonal structure of contact holes 301.

Figure 6A:
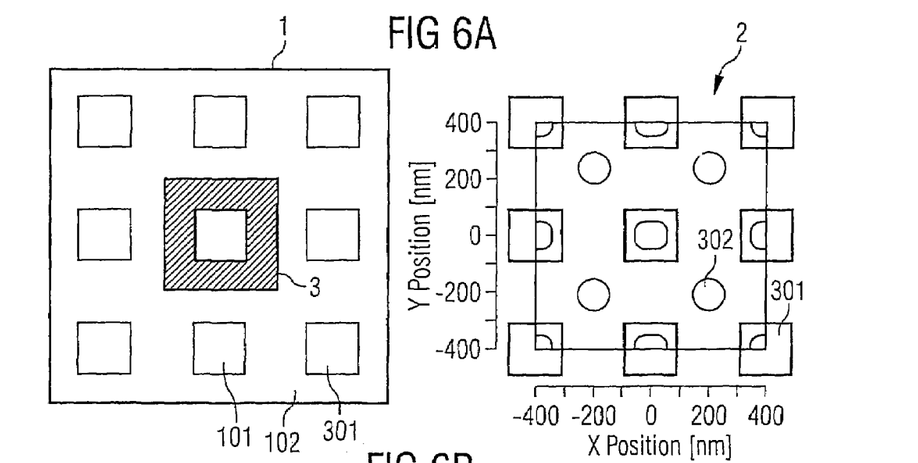
FIGS. 6A and 6B show a second embodiment of a phase-shift mask pattern according to the present invention (a) and its result when projected onto a wafer (b)

In another embodiment, a mask 1 including a matrix of patterns 3 each made of just one contact hole 301, is given in FIG. 6. The relative positions in this embodiment are therefore grid-structured as compared to the diagonal structure of FIG. 5. The contact hole size is chosen to 180 nm×180 nm at the design stage to give a surface area of the first fully transparent portion 101 of 32,400 nm². The surrounding semitransparent second portion 102 of this HTPSM comprises 127,600 nm². The transmission, which fulfils the condition according to the present invention, therefore amounts to roughly 25.4% counted as electrical field strength transmission. The ordinarily provided power of light transmission of the corresponding HTPSM is then about 6.4% As can easily be inferred from FIG. 4 even more advantageous embodiments of high transition HTPSM, e.g., transmission of electrical light larger than 45%, offer a larger contrast through larger first order harmonics. An electrical field transmission of 25.4% corresponds to an attenuation of 74.6%, giving the value $(x-1)=1.746$ in FIG. 4 on the x-axis. The first order amplitude amounts to roughly $3.2/2\pi \ldots 3.3/2\pi$, which is better than those values for conventional HTPSM or APSM. In the case of no attenuation, i.e., $(x-1)=2$ the curve in FIG. 4 approaches to the chromeless PSM case. Nevertheless, the diagram of FIG. 4 is for the case of lines-and-spaces patterns.

Figure 6B:
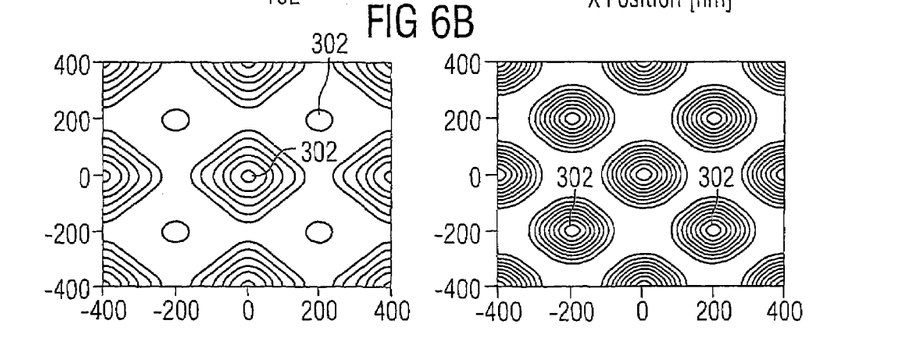

A situation of deviation from this embodiment is displayed in FIG. 6B, analogously to FIG. 5B.

Figure 7A:
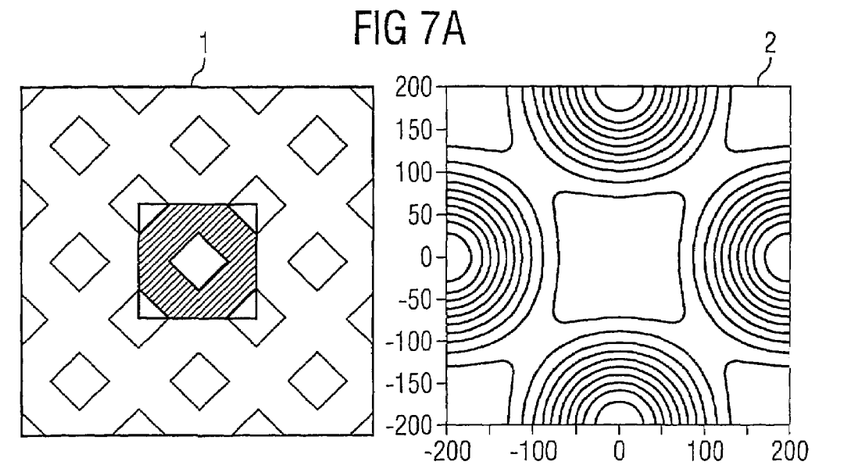
FIGS. 7A and 7B illustrates the pattern of FIGS. 6A and 6B with a different rotation angle, illustrating the frequency doubling on a semiconductor wafer.
Figure 7B:
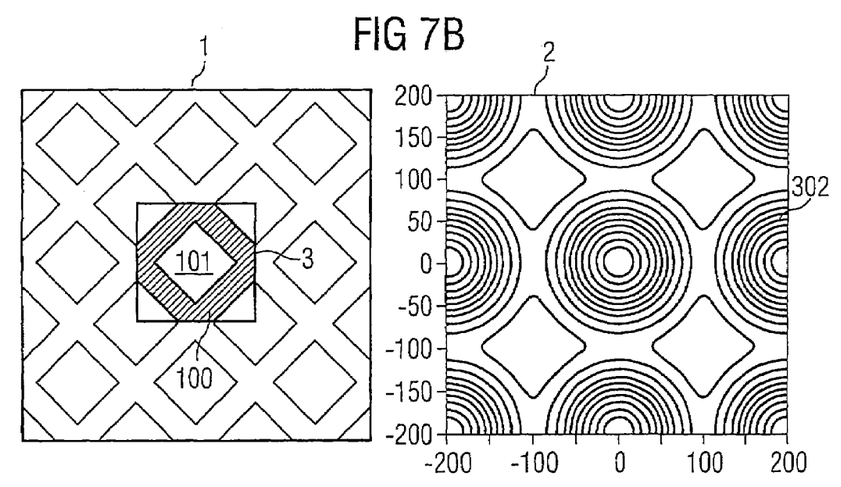

In FIGS. 7A and 7B, a similar embodiment as that shown in FIG. 6 is depicted just being rotated by 45 degrees. Here, the case of a chromeless PSM is displayed, necessitating equal size surface areas (FIG. 7B), since there is nearly no attenuation. In FIG. 7A a mask is shown, which does not fulfil the conditions according to the present invention. Frequency doubling occurs only in the case of the basic shapes shown in FIG. 7B, which can be seen on the right hand sides of FIGS. 7A and 7B.

Figure 8:
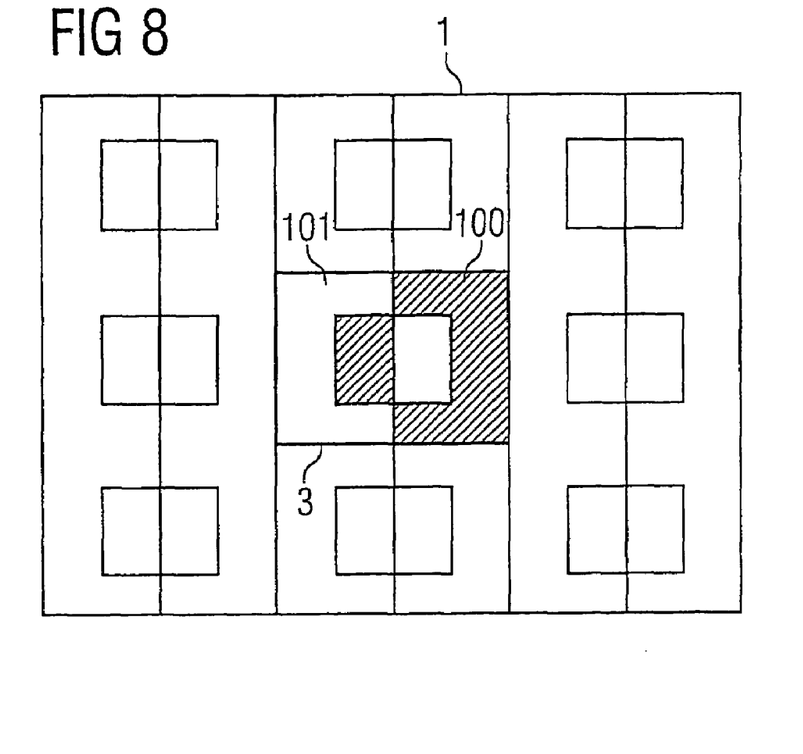
FIG. 8 shows another embodiment of a pattern according to the present invention, referring to chromeless phase-shift masks.
Figure 9:
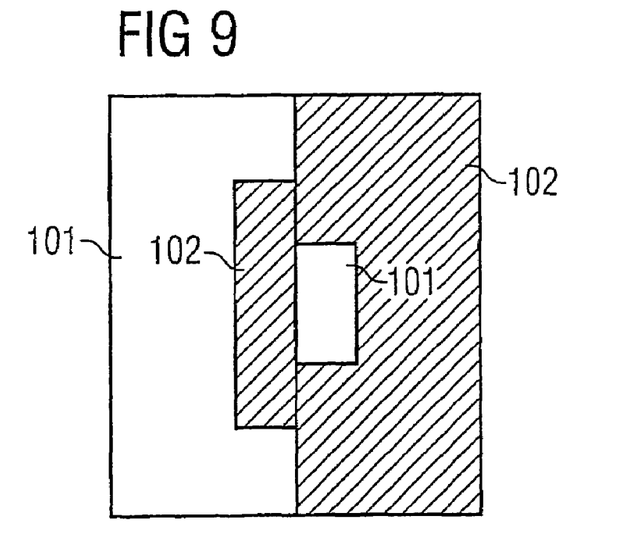
FIG. 9 shows another embodiment of a pattern, similar to FIG. 8, but for attenuated phase-shift masks.

Another embodiment of basic shapes in chromeless PSM is shown in FIG. 8. The shape according to the present invention results in elongated imaged structures on the wafer, which can be modelled to handle line shortening. By expanding the structures or portions of a pattern in the y-direction of FIG. 8, the elongation of the resulting imaged structures on the wafer can also be varied in the y-direction, without losing the condition of vanishing zero-order-diffraction and thus frequency doubling. Transferring the embodiment of FIG. 8 to the case of attenuated phase-shift masks, the U-form in combination with the rectangle giving the basic shape according to FIG. 8 is modified to obey the condition of the present invention as can be seen in FIG. 9.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE NUMERALS 1 mask
2 semiconductor wafer
3 pattern
3' further pattern
6 pupil plane, Fourier spectrum
7 objective lens system
8 irradiating light
11 chrome, third portion
20 zero order diffraction
21 first order diffraction, first harmonic
22 second order diffraction
40 electrical field strength of light flow
100 first portion, phase-shifted (APSM, chromless)
101 second portion, no phase-shift
102 first portion, phase-shifted (HTPSM)
201 surface area of first portion
202 surface area of second portion 301 contact hole
302 structure image of contact hole on wafer

We claim:

1. A phase shift mask, comprising:
   first portions arranged in a pattern across the phase shift mask, the first portions having a first area, a first transmittance of electric field strength of light to be irradiated through the phase shift mask, and a first phase shift characteristic with respect to light traversing the phase shift mask through the first portions; and
   at least one second portion disposed adjacent the pattern of first portions across the phase shift mask, the second portion having a second area, a second transmittance of electric field strength of light to be irradiated through the phase shift mask, the second transmittance being different from the first transmittance, and a second phase shift characteristic with respect to light traversing the phase shift mask through the second portion;
   wherein the product of the first area and the first transmittance is substantially equal to the product of the second area and the second transmittance, such that a zero order diffraction of light is substantially absent from light irradiated through the phase shift mask.

2. The phase-shift-mask according to claim 1 further comprising a third portion that is not transparent to light.

3. The phase-shift-mask according to claim 1, wherein the first portions have a first width extending in a first direction and a first length extending in a second direction that is orthogonal to the first direction, and the second portion has a second width extending in the first direction between adjacent first portions and a second length extending in the second direction between adjacent first portions, the ratio of the first width to the second width being different from unity, and a the ratio of the first length to the second length being different from unity.

4. The phase-shift mask according to claim 1, wherein the flint portions are arranged symmetrically about at least one axis.

5. The phase-shift mask according to claim 2, wherein the first portions are arranged symmetrically about two orthogonal axes.

6. The phase-shift mask according to claim 1, wherein each of the first portions comprises a square, and the second portion comprises a set of four lines bordering and enclosing four sides of the square of each of the first portions.

7. The phase-shift mask according to claim 1, wherein:
   each of the first portions comprises a first sub-pattern having a U-shape;
   the second portion comprises a plurality of second sub-patterns each having a U-shape;
   open ends of the U-shapes of adjacent first and second sub-patterns are orientated towards each other;
   each of the first portions comprises a third rectangular sub-pattern, which is enclosed on three sides by an adjacent second sub-pattern of the second portion; and
   the second portion comprises a plurality of fourth rectangular sub-pattern, each of which is enclosed on three sides by an adjacent first sub-pattern of the first portion.

8. The phase-shift mask according to claim 1, wherein the first and second transmittance are greater than 45 percent of the irradiated light.

* * * * *